United States Patent
Tonegawa et al.

(10) Patent No.: US 6,252,778 B1
(45) Date of Patent: Jun. 26, 2001

(54) COMPLEX ELECTRONIC COMPONENT

(75) Inventors: Ken Tonegawa, Otsu; Harufumi Mandai, Takatsuki; Tomoya Bando, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/177,026

(22) Filed: Oct. 22, 1998

(30) Foreign Application Priority Data

Oct. 23, 1997 (JP) .................................................... 9-291172

(51) Int. Cl.$^7$ ................................. H05K 1/03; H05K 1/16
(52) U.S. Cl. ...................... 361/761; 361/760; 361/816; 361/818; 361/728; 361/762; 361/763; 439/68; 439/101; 257/737; 257/738; 257/750
(58) Field of Search ..................... 361/760, 761, 361/816, 818, 765, 728, 748, 762, 763, 777; 333/186–192, 32, 193; 310/313 R, 348, 366; 439/68, 101; 257/737, 738, 750

(56) References Cited

U.S. PATENT DOCUMENTS

| | | | |
|---|---|---|---|
| 5,422,615 | * | 6/1995 | Shibagaki et al. .................... 333/246 |
| 5,438,305 | * | 8/1995 | Hikita et al. ............................ 333/32 |
| 5,459,368 | * | 10/1995 | Onishi et al. ......................... 310/313 |
| 5,699,027 | * | 12/1997 | Tsuji et al. ............................ 333/193 |
| 5,786,738 | * | 7/1998 | Ikata et al. ........................... 333/133 |
| 5,818,145 | * | 10/1998 | Fukiharu ............................ 310/313 R |
| 5,859,473 | * | 1/1999 | Ikata et al. ........................... 257/723 |
| 5,949,305 | * | 9/1999 | Shimamura .......................... 333/193 |
| 6,025,761 | * | 2/2000 | Watanabe et al. ................... 333/133 |

FOREIGN PATENT DOCUMENTS

| | | |
|---|---|---|
| 19621353 | 2/1997 | (DE) . |
| 951206 | 2/1997 | (JP) . |

OTHER PUBLICATIONS

European Search Report dated Apr. 12, 1999, of Appln # 98–12–0026 (EPO).

* cited by examiner

*Primary Examiner*—Jeffrey Gaffin
*Assistant Examiner*—David Foster
(74) *Attorney, Agent, or Firm*—Ostrolenk, Faber, Gerb & Soffen, LLP

(57) ABSTRACT

The invention provides a complex electronic component, comprising; a multilayer substrate formed by laminating a plurality of dielectric layers; a first concave part being provided at least at the bottom surface of said multilayer substrate; a filter comprising at least one first passive element disposed within said multilayer substrate; an external terminal provided on at least one of the flat portion of the bottom surface and the side face of said multilayer substrate; either one of an active element or a second passive element mounted on the top surface of said multilayer substrate, a surface acoustic wave element mounted inside of said first concave portion of said multilayer substrate; and a flat cap provided at the opening of said first concave portion of said multilayer substrate so as to cover said opening said first concave portion.

The size of the above complex electronic component is compact.

12 Claims, 2 Drawing Sheets

COMPLEX ELECTRONIC COMPONENT

BACKGROUND OF THE INVENTION

1. Field of the Invention

The present invention relates to a complex electronic component to be used for, for example, mobile communication devices, especially to a complex electronic component in which a surface acoustic wave element is mounted in a concave portion of a multilayer substrate and a filter comprising a passive element is disposed within the multilayer substrate.

2. Description of the Related Art

FIG. 4 shows a common cross section of conventional complex electronic components 50 provided with a multilayer substrate 51 inside of which a LC filter is disposed. A concave portion 52 is provided on the top surface of the multilayer substrate 51 and a surface acoustic wave filter 53 as a bare tip is mounted inside of the concave portion 52, an IC 54 and a capacitor 55 being mounted on the top surface of the flat portion of the multilayer substrate 51 except the concave portion 52. The concave portion 52 is covered with a flat cap 56 made of a metal.

However, a concave portion for mounting the surface acoustic wave element and a flat portion for mounting the IC and capacitor should be provided on the top surface of the multilayer substrate in the conventional complex electronic component as described above. In other words, the size of the multilayer substrate becomes large due to two-dimensional arrangement of a plurality of components on the top surface of the multilayer substrate when the number of the component is increased, causing a problem that the size of the complex electronic component also becomes large.

SUMMARY OF THE INVENTION

The object of the present invention, carried out for solving the foregoing problems, is to provide a complex electronic component capable of being compacted.

The preferred embodiment of the present invention provides a complex electronic component, comprising; a multilayer substrate formed by laminating a plurality of dielectric layers; a first concave part being provided at least at the bottom surface of said multilayer substrate; a filter comprising at least one first passive element disposed within said multilayer substrate; an external terminal provided on at least one of the flat portion of the bottom surface and the side face of said multilayer substrate; either one of an active element or a second passive element mounted on the top surface of said multilayer substrate, a surface acoustic wave element mounted inside of said first concave portion of said multilayer substrate; and a flat cap provided at the opening of said first concave portion of said multilayer substrate so as to cover said opening said first concave portion.

According to the above described complex electronic component, since either one of the active element or the passive element is mounted on the top surface of the multilayer substrate accommodating a filter comprising a passive element and the surface acoustic wave filter is mounted in the concave portion provided on the bottom surface of the multilayer substrate, the function required for the multilayer substrate can be allotted to the top and bottom surfaces to compact the multilayer substrate accommodating the filters. Consequently, the complex electronic component can be made compact thereby compacting the mobile communication device mounting the complex electronic component.

The above described complex electronic component may further comprise a second concave portion on said top surface of said multilayer substrate, and either said active element or said second passive element may be mounted on said second concave portion.

In the above structre, since the second concave portion is provided on the top surface of the multilayer substrate accommodating a filter comprising the passive element and either one of the active element or the passive element is mounted in the second concave portion, the height of the multilayer substrate can be made low, allowing the complex electronic component to be low height to result in a more compact size. Consequently, the mobile communication device mounting the complex electronic component becomes more compact.

Other features and advantages of the present invention will become apparent from the following description of the invention which refers to the accompanying drawings.

DETAILED DESCRIPTION OF THE PREFERRED EMBODIMENTS

Figure 1:
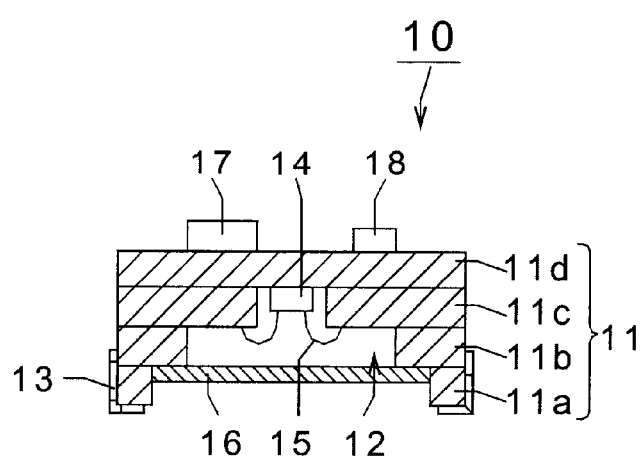
FIG. 1 is a cross section of the complex electronic component according to the first preferred embodiment of the present invention.

FIG. 1 shows the cross section of the complex electronic component in the first preferred embodiment according to the present invention. The complex electronic component 10 is provided with a multilayer substrate 11 inside of which a LC filter (not shown in the drawing) comprising a transfer circuit and capacitor are disposed, a first concave portion 12 being provided on the bottom surface of the multilayer substrate 11 and external electrodes 13 being provided on the faces from the bottom surface through the side face of the multilayer substrate 11. The multilayer substrate 11 as described above is produced, for example, by the following method.

Dielectric layers from 11a through 11d are prepared by laminating green sheets composed of a ceramic material sintered at a low temperature. Then, a required wiring pattern, strip electrodes for forming transfer circuits, a capacitor electrode for forming a capacitor and a ground electrode (not shown in the drawing) are printed on the dielectric layers from 11a through 11d using a copper paste. In the next step, a hole to serve as a first concave portion or cavity is provided in the dielectric layers from 11a through 11c by punching, along with providing a hole for forming required via-hole electrodes (not shown in the drawing). The copper paste is filled into the hole for forming the via-hole electrode. The dielectric layers from 11a through 11d thus obtained are laminated and pressed, followed by baking at 960° C. for 1 hour in a neutral or weakly reducing atmosphere.

Finally, the external electrodes 13 are formed by coating, followed by baking, the copper paste on the prescribed portion of the dielectric layer from the bottom surface through the side face.

A surface acoustic wave filter 14 (referred to a SAW filter hereinafter), is disposed as a bare chip inside of the first concave portion 12 of the multilayer substrate 11 obtained as described above. The filter is fixed by a tie-bonding and electrical continuity of the filter is accomplished through bonding wires 15 formed by a wire-bonding. The tie-bonding may also serve for electrical continuity.

After mounting the SAW filter 14 in the first concave portion 12, the first concave portion 12 is sealed with a flat cap 16. The flat cap 16 is composed of an arbitrary material such as a metal, a resin or a ceramic. When the flat cap 16 is composed of a metal, a metal film is previously formed on the portion of the multilayer substrate 11 making a contact with the flat cap 16 to join with the flat cap 16 by burying a solder into the gap between the flat cap 16 and the multilayer substrate 11. When the flat cap 16 is composed of a resin or a ceramic, the flat cap 16 is adhered to the multilayer substrate 11 with a heat curing type adhesive. Otherwise, The first concave portion 12 may be filled with a resin.

The complex electronic component 10 is completed by mounting an IC 17 as an active element and a capacitor 18 as a passive element on the flat top surface of the multilayer substrate 11 after sealing the first concave portion 12 provided on the bottom surface of the multilayer substrate 11 with the flat cap 16.

Characteristics of the complex electronic component are evaluated thereafter for respective complex electronic components 10 via the external electrodes 13 provided on the side faces of the multilayer substrate 11 to discriminate between the good and defective products.

The construction of the complex electronic component according to the first preferred embodiment of the present invention, mounting the IC and capacitor on the top surface of the multilayer substrate accommodating the LC filter and the SAW filter in the first concave portion provided on the bottom surface of the multilayer substrate, allows the function required for the multilayer substrate to be allotted to the top and bottom surfaces, thereby making the multilayer substrate accommodating the filter small to result in a compact size complex electronic component.

Figure 2:
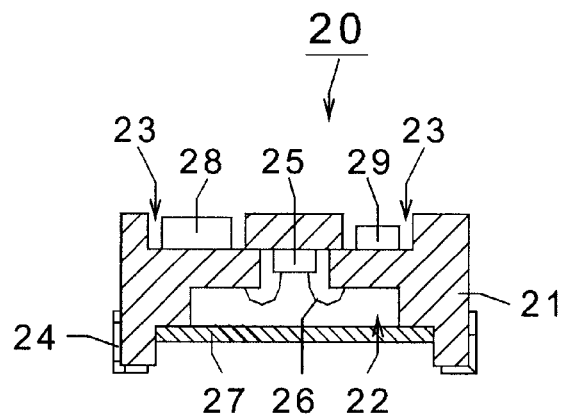
FIG. 2 is a cross section of the complex electronic component according to the second preferred embodiment of the present invention.

FIG. 2 shows the cross section of the complex electronic component according to the second preferred embodiment of the present invention. The complex electronic component 20 is provided with a multilayer substrate 21 inside of which a LC filter (not shown in the drawing) comprising a transfer circuit and a capacitor is disposed, the first concave portion 22 and the second concave portion 23 being provided on the top and bottom surfaces of the multilayer substrate 21, respectively, and external electrodes being provided on the side faces of the multilayer substrate 21. The multilayer substrate 21 is produced by the same method as described in producing the multilayer substrate 11 in the first embodiment.

The surface acoustic wave filter 25 (referred to a SAW filter hereinafter), or a surface acoustic wave element, is disposed within the first concave portion 22 provided at the bottom surface of the multilayer substrate 21 as a bare tip, which is fixed with a tie-bonding forming an electric continuity with the bonding wire 26 formed of a wire bonding. The tie-bonding may also serve for electric continuity.

The first concave portion 22 is sealed with the flat cap 27 after mounting the SAW filter 25 in the first concave portion 22. The flat cap 27 is constructed of an arbitrary material such as a metal, a resin or a ceramic. Likewise the case in the first embodiment, a metal film is previously formed on the portion of the multilayer substrate 21 to make a contact with the flat cap 27 to join the multilayer substrate 21 with the flat cap 27 by burying a solder into the gap between the flat cap 27 and multilayer substrate 21 when the flat cap 27 is composed of a metal. When the flat cap 27 is composed of a resin or a ceramic, the flat cap 16 is adhered to the multilayer substrate 21 with a heat curing type adhesive. Otherwise, The first concave portion 21 may be filled with a resin.

After sealing the first concave portion 22 provided on the bottom surface of the multilayer substrate 21 with the flat cap 27, the IC 28 as an active element and the capacitor 29 as a passive element are mounted in the second concave portion 23 provided on the top surface, thereby completing the complex electronic component 20.

Characteristics of the complex electronic component are evaluated thereafter for respective complex electronic components 20 via the external electrodes 24 provided on the side faces of the multilayer substrate 21 to discriminate between the good and defective products.

According to the complex electronic component in the second preferred embodiment hitherto described, the second concave portion is provided on the top surface of the multilayer substrate accommodating the LC filter to allow the IC and capacitor to be mounted in the second concave portion, thereby enabling to make the height of the multilayer substrate low for more compacting the component.

Figure 3:
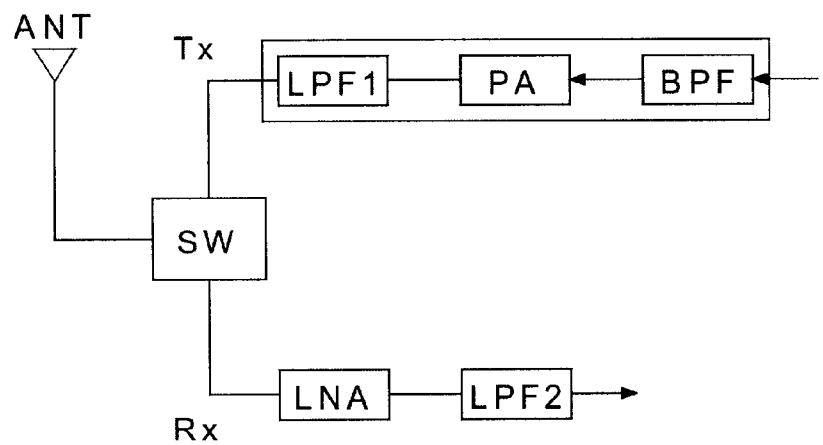
FIG. 3 is a block diagram of the compact size portable telephone as a mobile communication device.
Figure 4:
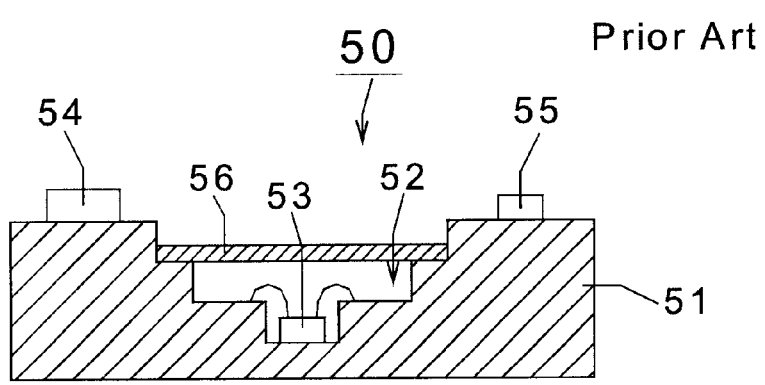
FIG. 4 is a cross section showing the conventional complex electronic component.

FIG. 3 shows a block diagram of a compact size portable telephone (Portable Handyphone System; PHS) as an example of mobile communication devices. In FIG. 3, ANT is an antenna, SW is a switch for allotting and coupling high frequency signals in different frequency bands, LPF1 is a low-pass filter as a first filter of a transmission (Tx) side, PA is a high output amplifier at the Tx side, BPF is a band-pass filter as a second filter at the Tx side, LNA is a low-noise amplifier at the transmission (Rx) side and LPF2 is a low-pass filter as a filter at the Rx side.

On the premise that the LC filter (FIG. 1 and FIG. 2) accommodated in the multilayer substrate 11 or 21 of the complex electronic component 10 or 20 corresponds to the low-pass filter LPF1, the SAW filter 14 or 25 (FIG. 1 and FIG. 2) mounted in the concave portion 12 or 22 on the bottom surface of the multilayer substrate 11 or 21 corresponds to the band-pass filter BPF and the IC 17 or 28 (FIG. 1 and FIG. 2) mounted on the top surface or in the second concave portion 23 of the multilayer substrates 11 or 21 corresponds to the high output amplifier PA in the PHS having the construction as described above, the part indicated by the broken line in FIG. 3 can be constructed by one complex electronic component 10 or 20 (FIG. 1 or FIG. 2) to enable compacting the PHS.

While the cases in which both of the active and passive elements are mounted on the top surface of the multilayer substrate or in the concave portion formed on the top surface of the multilayer were explained in the foregoing embodiments, the same effect can be obtained when only the active element or the passive element is mounted.

Although the case when the active and passive elements to be mounted on the top surface or in the concave portion on the top surface of the substrate are tip components was described, the same effect can be attained when the tips are mounted as bare-tips. Reliability may be well improved by covering the active and passive elements as bare-tips with a resin.

While the LC filter composed of a transfer circuit and capacitor was shown as a filter composed of passive elements accommodated in the multilayer substrate, the same effect can be obtained by the LC filter merely composed of a transfer circuit and a RC filter composed of a built-in resistor and a capacitor.

While the invention has been particularly shown and described with reference to preferred embodiments thereof, it will be understood by those skilled man in the art that the forgoing and other changes in form and details may be made therein without departing from the spirit of the invention.

What is claimed is:

1. A complex electronic component, including:
    a first filter comprised of:
        a multilayer ceramic structure formed of a plurality of ceramic green sheet layers fired to produce an integral unit;
        at least one strip electrode;
        a capacitor electrode, the strip electrode and the capacitor electrode being formed on surfaces of the green sheet layers before the firing thereof; and
        a second filter comprised of a surface acoustic wave element mounted inside a cavity formed in plurality of the layers at the bottom of the first filter.

2. The complex electronic component according to claim 1, further comprising a circuit device mounted in a second cavity formed in a plurality of the layers at the top of the first filter.

3. The complex electronic component according to claim 2, wherein the circuit device is an active electronic element.

4. The complex electronic component according to claim 1, further including a circuit device mounted on the first filter on the side thereof opposite the second filter.

5. The complex electronic component according to claim 1, wherein the bottom surface of the first filter which surround the first cavity forms a base for mounting the complex electronic component on a circuit board.

6. The complex electronic component according to claim 5, wherein the portion of the first filter which forms the base includes external conductors for electrically coupling the complex electronic component to the circuit board.

7. An RF module comprising the transmission side of a radio communication device, the RF module including:
    a low-pass filter comprised of:
        a multilayer ceramic structure formed of a plurality of ceramic green sheet layers fired to produce an integral unit;
        at least one strip electrode;
        a capacitor electrode, the strip electrode and the capacitor electrode being formed on surfaces of the green sheet layers before the firing thereof; and
        a band-pass filter comprised of a discrete circuit element mounted inside a cavity formed in plurality of the layers at the bottom of the first filter.

8. The RF module according to claim 7, wherein the band pass filter is surface acoustic wave device.

9. The RF module according to claim 7, further comprising an amplifier circuit mounted in a second cavity formed in a plurality of the layers at the top of the low-pass filter.

10. The RF module according to claim 7, further comprising an amplifier circuit mounted on the opposite side of the low-pass filter from the band-pass filter.

11. The RF module according to claim 7, wherein the bottom surface of the low-pass filter which surrounds the first cavity forms a base for mounting the RF module on a circuit board.

12. The RF module according to claim 11, wherein the portion of the low-pass filter which forms the base includes external conductors for electrically coupling the RF module to the circuit board.

* * * * *